(12) United States Patent
Shao et al.

(10) Patent No.: US 10,305,369 B2
(45) Date of Patent: May 28, 2019

(54) NOISE REDUCTION IN A VOLTAGE CONVERTER

(71) Applicant: Analog Devices Global, Hamilton (BM)

(72) Inventors: Bin Shao, Andover, MA (US); Sean Kowalik, Chelmsford, MA (US); Alan S. Walsh, Medford, MA (US); Danzhu Lu, Shanghai (CN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/443,950

(22) Filed: Feb. 27, 2017

(65) Prior Publication Data

US 2018/0226878 A1 Aug. 9, 2018

Related U.S. Application Data

(63) Continuation of application No. PCT/CN2017/072959, filed on Feb. 6, 2017.

(51) Int. Cl.

| H02M 1/12 | (2006.01) |
|---|---|
| G01S 7/48 | (2006.01) |
| H02M 3/158 | (2006.01) |
| H02M 1/14 | (2006.01) |
| H02M 3/335 | (2006.01) |
| G01S 7/484 | (2006.01) |
| G01S 7/486 | (2006.01) |
| H01S 5/042 | (2006.01) |
| H02M 1/08 | (2006.01) |
| H03M 1/80 | (2006.01) |

(52) U.S. Cl.
CPC ............ *H02M 1/12* (2013.01); *H02M 1/143* (2013.01); *H02M 3/158* (2013.01); *H02M 3/33507* (2013.01); *G01S 7/484* (2013.01); *G01S 7/4865* (2013.01); *H01S 5/0428* (2013.01); *H02M 1/08* (2013.01); *H03M 1/808* (2013.01)

(58) Field of Classification Search
CPC .......... H02M 1/12; H02M 3/158; H02M 1/08; H01S 5/0428; G01S 7/484; G01S 7/4865
See application file for complete search history.

(56) References Cited

U.S. PATENT DOCUMENTS 5,264,740 A * 11/1993 Wright ............... H03K 3/02337
327/63
7,508,181 B2 * 3/2009 Chen ..................... H02M 3/156
323/266

(Continued)

OTHER PUBLICATIONS

Tanaka, Tetsuro, et al., "Random-Switching Control in DC-To-DC Converters", IEEE, (1989), 500-507.

(Continued)

*Primary Examiner* — Emily P Pham
(74) *Attorney, Agent, or Firm* — Schwegman Lundberg & Woessner, P.A.

(57) ABSTRACT

This application discusses techniques for reducing the energy of an output ripple in a voltage converter at a switching frequency of the voltage converter. In certain examples, an amplitude of a reference voltage can be modulated with a time-varying random value or pseudo-random value to provide a reduction in the energy of the output ripple at the switching frequency of the voltage converter.

24 Claims, 8 Drawing Sheets

(56) References Cited

U.S. PATENT DOCUMENTS

| | | | | |
|---|---|---|---|---|
| 8,212,538 B2* | 7/2012 | Nishida | ............... | H02M 3/1563 |
| | | | | 323/271 |
| 8,228,073 B2* | 7/2012 | Li | ....................... | H03M 1/1014 |
| | | | | 324/426 |
| 8,373,395 B2* | 2/2013 | Yashiki | ................ | H02M 3/156 |
| | | | | 323/222 |
| 8,970,194 B2* | 3/2015 | Li | ........................... | G05F 1/575 |
| | | | | 323/282 |
| 9,152,162 B2* | 10/2015 | Lee | ........................ | G05F 1/575 |
| 9,353,017 B2* | 5/2016 | Krishna | ..................... | G05F 3/02 |
| 2010/0301827 A1 | 12/2010 | Chen et al. | | |
| 2013/0335052 A1* | 12/2013 | Li | ........................... | G05F 1/618 |
| | | | | 323/285 |
| 2014/0375286 A1* | 12/2014 | Jiang | .................... | H02M 3/156 |
| | | | | 323/271 |
| 2015/0091535 A1 | 4/2015 | Fan | | |
| 2016/0072519 A1* | 3/2016 | Shill | ........................ | H03M 1/68 |
| | | | | 341/154 |
| 2016/0094129 A1* | 3/2016 | Schmitz | ................ | H02M 3/158 |
| | | | | 323/271 |

OTHER PUBLICATIONS

"International Application Serial No. PCT/IB2018/000196, International Search Report dated Jun. 15, 2018", 4 pgs.
"International Application Serial No. PCT/IB2018/000196, Written Opinion dated Jun. 15, 2018", 6 pgs.

* cited by examiner

NOISE REDUCTION IN A VOLTAGE CONVERTER

CLAIM OF PRIORITY

This application is a continuation under 35 U.S.C. § 111(a) and claims benefit of priority to International Patent Application Serial No. PCT/CN2017,072959, filed Feb. 6, 2017, which is hereby incorporated by reference herein in its entirety.

FIELD OF THE DISCLOSURE

The present disclosure relates to systems and methods for filtering electronic noise in a voltage converter.

BACKGROUND

Certain voltage converters include a comparator with hysteresis in a feedback control loop to provide an output voltage.

SUMMARY OF THE DISCLOSURE in certain systems, a voltage converter can receive a first DC voltage and deliver a second DC voltage, such as to provide power to an electronic component. The voltage converter can include a control loop, such as that using hysteresis. In a voltage converter including a hysteretic control loop, an output of the voltage converter can include an AC component at a switching frequency of the voltage converter. In precision applications, such as where the voltage converter can provide a reference voltage for a sequential approximation register (SAR) analog-to-digital converter (ADC), the frequency component at the switching frequency can cause a reduced performance of the SAR ADC (e.g., the precision of the SAR ADC may be reduced from 18 bits to 16 bits). The inventors have recognized, among other things, that it is possible to provide a voltage converter having a reduced AC component at the switching frequency, such as by modulating at least one signal in the control loop of the voltage converter. Further features of the disclosure are provided in the appended claims, which features may optionally be combined with each other in any permutation or combination, unless expressly indicated otherwise elsewhere in this document.

In an aspect, the disclosure can feature a method for voltage conversion providing a reduction in an output ripple energy at a switching frequency of a voltage converter. The method can include receiving an input voltage and providing an output voltage having a frequency component at the switching frequency. The method can also include generating a control signal based on the output voltage and a reference voltage. The method can also include switching the input voltage based on the control signal. The method can also include modulating at least one of the reference voltage or a delay used to generate the control signal. The method can also include driving a load with the output voltage and the switching frequency can depend on the load. The method can also include modulating an amplitude of the reference voltage with a time-varying random value or pseudo-random value, such as to provide a reduction in the output ripple energy at the switching frequency of the voltage converter. The method can also include converting at least a portion of output ripple energy at the switching frequency to energy at a different frequency. Modulating the amplitude of the reference voltage can include providing a time-varying randomly generated trimming code to an analog-to-digital converter. The method can also include delaying the control signal by a varying random amount of time, such as to provide a reduction in the output ripple energy at the switching frequency of the voltage converter. The method can also include converting at least a portion of output ripple energy at the switching frequency to energy at a different frequency. The method can also include charging a capacitor with a time-varying randomly generated current based on the control signal to provide the delay in the control signal. Modulating at least one of the reference voltage or a delay used to generate the control signal can reduce an output ripple energy at a multiple of the switching frequency of the voltage converter.

In an aspect, the disclosure can feature a voltage converter for providing a reduction in an output ripple energy at a switching frequency of the voltage converter. The voltage converter can include switching voltage converter circuitry configured to receive an input voltage and provide an output voltage having a frequency component at the switching frequency. The voltage converter can also include a control element configured to provide a control signal based on the output voltage and a reference voltage, the control signal controlling the switching voltage converter circuitry. The voltage converter can also include modulation circuitry configured to modulate at least one of the reference voltage or a delay used to generate the control signal. The switching voltage converter circuitry can be configured to drive a load with the output voltage and the switching frequency can depend on the load. The modulation circuitry can be configured to modulate an amplitude of the reference voltage with a time-varying random value or pseudo-random value, such as to provide a reduction in the output ripple energy at the switching frequency of the voltage converter. The modulation circuitry can be configured to convert at least a portion of output ripple energy at the switching frequency to energy at a different frequency. The modulation circuitry can be configured to provide a time-varying randomly generated or pseudo-randomly generated trimming code to an analog-to-digital converter. The voltage converter can also include variable delay circuitry configured to delay the control signal by a varying random or pseudo-random amount of time to provide a reduction in the output ripple energy at the switching frequency of the voltage converter. The modulation circuitry can be configured to convert at least a portion of output ripple energy at the switching frequency to energy at a different frequency. The voltage converter can also include a current source configured to charge a capacitor with a time-varying current in response to the control signal to provide the delay in the control signal. Modulating at least one of the reference voltage or a delay used to generate the control signal can reduce an output ripple energy at a multiple of the switching frequency of the voltage converter. The control element can include a hysteretic comparator configured to provide a first control signal if the output voltage exceeds the reference voltage by a first threshold amount and a second control signal if the output voltage is less than the reference voltage by more than a second threshold amount.

Figure 1A:
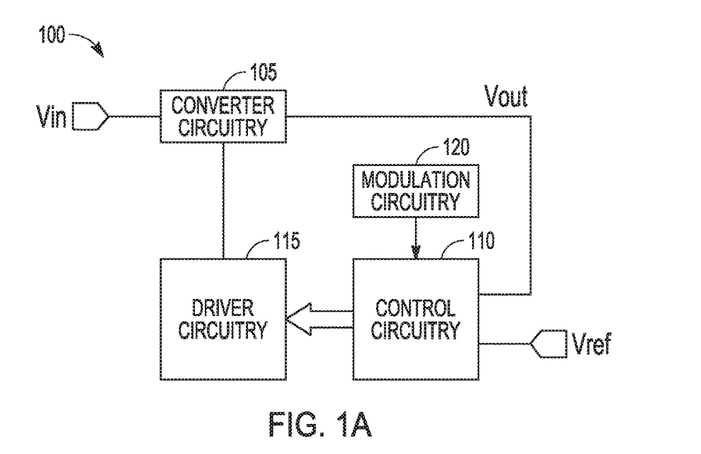
FIG. 1A illustrates a diagram of a voltage converter.

In an aspect, the disclosure can feature a voltage converter for providing a reduction in an output ripple energy at a switching frequency of the voltage converter, the voltage converter. The voltage converter can include a means for receiving an input voltage and providing an output voltage having a frequency component at the switching frequency. The means for receiving an input and providing an output can include converter circuitry, such as converter circuitry 105 as shown in FIG. 1. The voltage converter can also include a means for generating a control signal based on the output voltage and a reference voltage. The means for generating a control signal can include control circuitry, such as control circuitry 110 as shown in FIG. 1. The voltage converter can also include a means for switching the input voltage based on the control signal. The means for switching the input voltage can include driver circuitry, such as driver circuitry 115 as shown in FIG. 1. The voltage converter can also include a means for modulating at least one of the reference voltage or a delay used to generate the control signal. The means for modulating can include modulation circuitry, such as modulation circuitry 120 as shown in FIG. 1.

BRIEF DESCRIPTION OF THE DRAWINGS

The present disclosure will now be described, by way of example, with reference to the accompanying drawings, in which.

DETAILED DESCRIPTION OF EMBODIMENTS OF THE DISCLOSURE

FIG. 1A shows an example of a voltage converter 100. The voltage converter 100 can include converter circuitry 105, control circuitry 110, driver circuitry 115, and modulation circuitry 120. The converter circuitry 105 can include a connection to an input voltage and a connection to the control circuitry 110. The control circuitry 110 can include connections to a reference voltage, the converter circuitry 105, and the driver circuitry 115. The driver circuitry 115 can include a connection to the converter circuitry 105 and a connection to the control circuitry 110. The modulation circuitry 120 can include a connection to the control circuitry 110. During operation, an input voltage (Vin) can be provided to the converter circuitry 105. The converter circuitry 105 can convert the input voltage to an output voltage (Vout). The output voltage (Vout) can be used to drive a load. The output voltage can include a DC component and an output ripple including an AC component at a switching frequency of the voltage converter 100. The switching frequency can depend on the value of the load (e.g., the switching frequency can depend linearly on the load). The converter circuitry 105 can provide a scaled version of the output voltage (Vout) to the control circuitry 110. The control circuitry 110 can compare the scaled version of the output voltage (Vout) to a reference voltage (Vref), such as to provide a control signal. The control circuitry 110 can provide the control signal to the driver circuitry 115. The driver circuitry 115 can control the converter circuitry, such as by switching the input voltage, based on the received control signal, such as to reduce a difference between the scaled output voltage and the reference voltage. The modulation circuitry 120 can modulate the control signal provided by the control circuitry, such as to reduce the output ripple energy in the frequency component at the switching frequency.

Figure 1B:
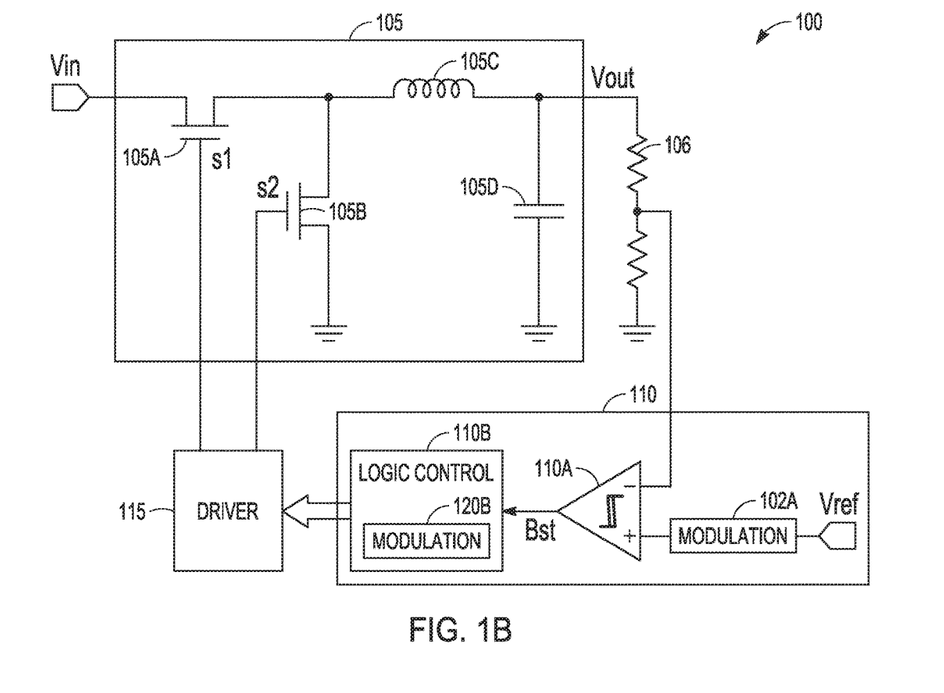
FIG. 1B illustrates a diagram of a voltage converter.

FIG. 1B shows an example of a voltage converter 100. The voltage converter 100 can include converter circuitry 105, a resistive divider 106, control circuitry 110, driver circuitry 115, and modulation circuitry 120a and 120b. The converter circuitry 105 can include a first transistor 105a and a second transistor 105b, an inductor 105c, and a capacitor 105d. The control circuitry 110 can include a hysteretic comparator 110a and logic control circuitry 110b. The converter circuitry 105 can include a connection to an input voltage and a connection to the control circuitry 110. The first transistor 105a can be connected to the driver circuitry, the input voltage (Vin), and the inductor 105c. The second transistor 105b can be connected to the driver circuitry, the inductor 105c, and an electrical ground. The inductor 105c can be connected to the first transistor 105a, the second transistor 105b, the output voltage, and to the capacitor 105d. The capacitor 105d can be connected to the inductor 105c, the output voltage, and to an electrical ground. The resistive divider can be connected to the output voltage, the control circuitry 110, the capacitor 105d, and the inductor 105c. The control circuitry 110 can include connections to a reference voltage, the converter circuitry 105, and the driver circuitry 115. The inputs of the hysteretic comparator 110a can be connected to the resistive divider 106, and to the reference voltage (Vref), and the output of the hysteric comparator 110a can be connected to the logic control circuitry 110b. The logic control circuitry 110b can be connected to the driver circuitry 115. The driver circuitry 115 can include a connection to the converter circuitry 105 and a connection to the control circuitry 110. The modulation circuitry 120 can include a connection to the control circuitry 110. During operation, the first transistor 120a can be activated by the driver circuitry 115, such as to connect the inductor 105c to an input voltage (Vin), such as to cause a rising current to flow through the inductor 105c. The first transistor 120a can then be deactivated, such as to disconnect the input voltage (Vin) from the inductor 105c. The second transistor 105b can then be activated such as to connect the inductor 105c to an electrical ground, such as to cause a falling current to flow through the inductor 105c. During the activation of the first transistor 105a and the second transistor 105b, the capacitor 105d can provide an output voltage (Vout). The output voltage (Vout) can be used to drive a load (e.g., a SAR ADC or other electronic component). A scaled version of the output voltage (Vout) and a reference voltage can be provided to the inputs of the hysteretic comparator 110a. The hysteretic comparator 110a can provide a first signal if the scaled output voltage exceeds a first threshold amount and a second signal if the scaled output voltage falls below a second threshold amount. The first threshold amount can be greater than the scaled reference voltage and the second threshold can be below the scaled reference voltage. The logic control circuitry 110*b* can provide control signals to the driver circuitry 115 based on the first and second signals received from the hysteretic comparator 110*a*. The driver circuitry 115 can then activate the transistors 105*a* and 105*b* based on the received control signals. For example, if the driver circuitry receives a control signal based on the first signal, the driver circuitry can provide a signal, such as to activate the second transistor 105*b* and deactivate the first transistor 105*a*. If the driver circuitry receives a control signal based on the second control signal, the driver circuitry can provide a signal, such as to activate the first transistor 105*b* and deactivate the second transistor 105*a*. The voltage converter circuitry 105 can thus be regulated by the control circuitry 110 and the driver circuitry 115, such as to provide an output voltage, such that the scaled output voltage approximates the reference voltage. The scaled output voltage can include a DC component approximately equal to the reference voltage and an output ripple including an AC component at a switching frequency of the voltage converter 100. The switching frequency can be determined by parameters in the control circuitry, such as the load, the first threshold amount, the second threshold amount, the value of the scaled reference voltage, and the overall delay in the control loop. In an example, the switching frequency can remain constant if the reference voltage is held constant.

Figure 1C:
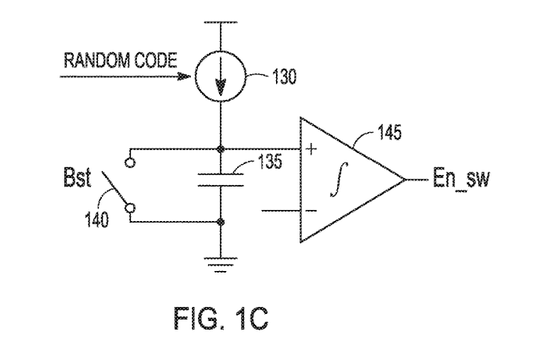
FIG. 1C illustrates a diagram of modulation circuitry.

FIG. 1C shows an example of modulation circuitry, such as modulation circuitry 120*b*. The modulation circuitry can include a current source 130, a switch 140, a capacitor 135, and a comparator 145. The current source 130 can be connected to the switch 140, the capacitor 135, and the non-inverting input terminal of the comparator 145. The capacitor 135 can be connected to an electrical ground, and to the switch 140, the current source 130, and to a non-inverting input terminal of the comparator 145. The inverting input terminal of the comparator can be connected to a reference voltage and the output terminal of the comparator can be connected to the driver circuitry 115. During operation, the control circuitry 110 can open the switch 140, such as to allow the current source 130 to charge the capacitor 135. The current source can be programmed with a time-varying random code or pseudo-random code, such as to supply a time-varying random value or pseudo-random value of current to charge the capacitor 135. After charging the capacitor to a voltage exceeding the reference voltage, the comparator can change output states, such as to provide a control signal having a time-varying delay to the driver circuitry 115.

Figure 2A:
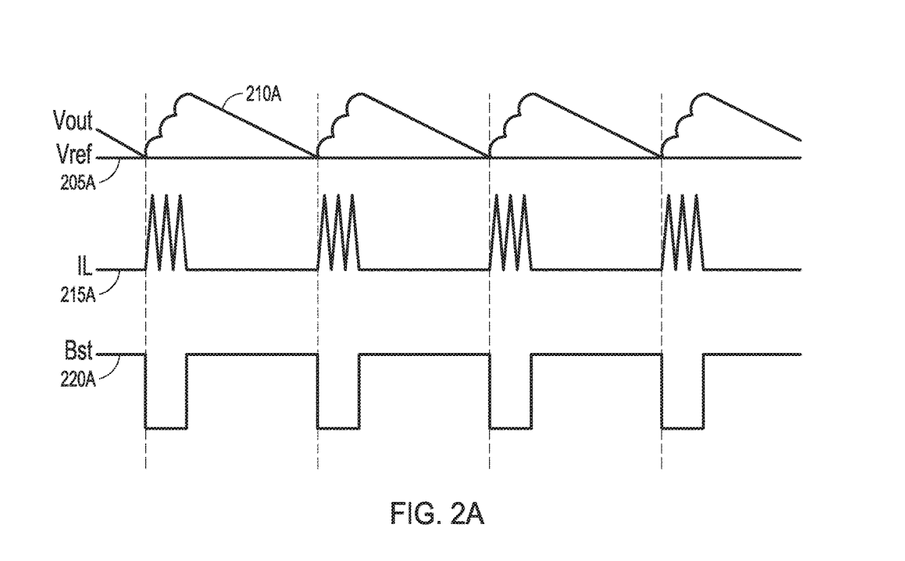
FIG. 2A illustrates an example of waveforms in a voltage converter.

FIG. 2A shows an example of waveforms in a voltage converter, such as voltage converter 100 where the reference voltage can be unmodulated. The reference voltage 215*a* can be unmodulated, and a difference between the unmodulated reference voltage and the output voltage 210*a* (Vout) can be provided to control circuitry, such as control circuitry 110. The control circuitry can provide a control signal 220*a* to driver circuitry, such as driver circuitry 115. The driver circuitry 115 can switch the input voltage (Vin) based on the received control signal, such as to provide a current 215*a* in an inductor, such as inductor 105*c*.

Figure 2B:
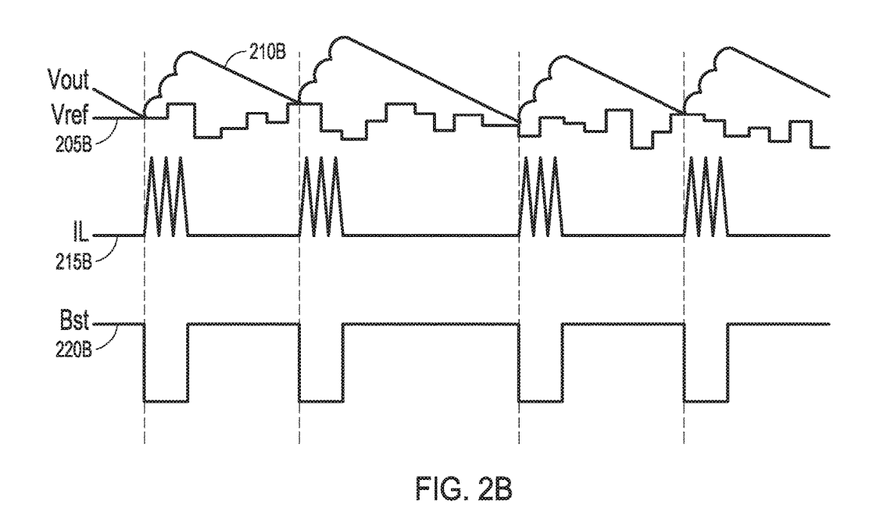
FIG. 2B illustrates an example of waveforms in a voltage converter.
Figure 3A:
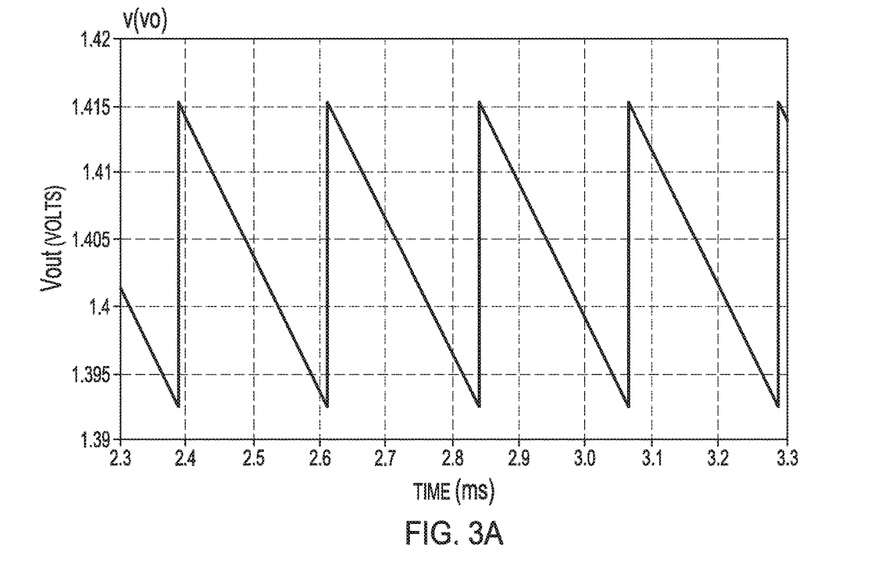
FIG. 3A illustrates an output voltage waveform in a voltage converter.
Figure 3B:
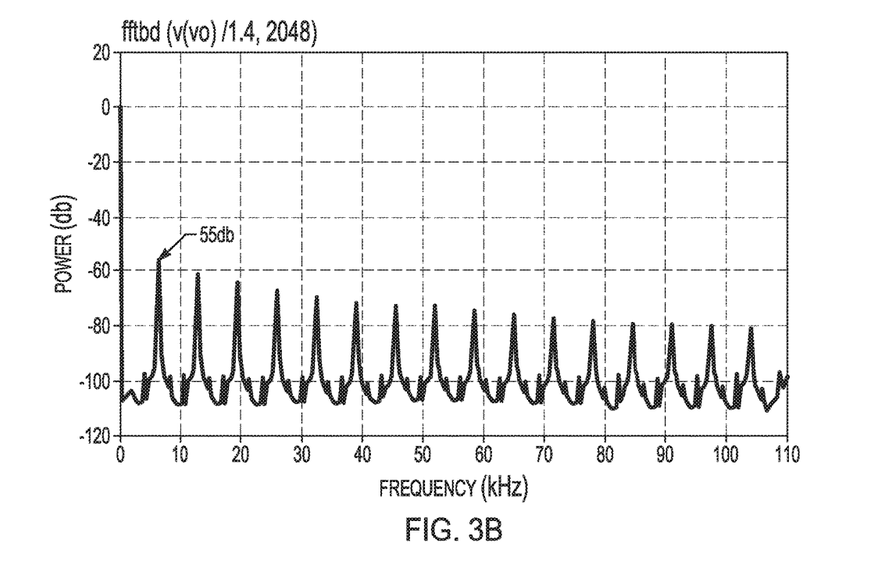
FIG. 3B illustrates an output power spectrum in a voltage converter.

FIG. 3A illustrates simulation results of an output voltage (Vout) of a voltage converter, such as voltage converter 100 where modulation circuitry 120 does not provide modulation. The output voltage (Vout) shown in FIG. 2A includes a sawtooth shape with a frequency of about 4.5 kHz, an average value of about 1.4 V and an amplitude of about 25 mV. FIG. 2B illustrates simulation results of a power spectrum at the output of a Voltage converter, such as Voltage converter 100 where modulation circuitry 120 does not provide modulation. The power spectrum as shown in FIG. 3B includes 0 dB peak at 0 Hz, and a component corresponding to the switching frequency of the Voltage converter having an amplitude of −55 dB at 4.5 kHz. The power spectrum also includes components at multiples of the switching frequency (e.g., two times the switching frequency and three times the switching frequency).

FIG. 2B shows an example of waveforms in a voltage converter, such as voltage converter 100 where the reference voltage can be modulated with a time-varying random value or time-varying pseudo-random value. In an example, the modulation depth can be in a range of 1% to 5%. In an example, the modulation depth can be in a range of 1% to 3%. In an example, the modulation depth can be in a range of 3% to 5%. In an example, the modulation depth can be in a range of 2% to 4%. In an example, the modulation depth can be in a range of 2.5% to 3.5%. In an example, the modulation depth can be approximately 3%. In an example, a modulation depth that is too small (e.g., less than 1%) can have a limited effect on the output ripple energy, while a modulation depth that is too large (e.g., greater than 10%) can increase the total output ripple energy. In an example, the time-varying random value or time-varying pseudo-random value can be based on a uniform probability distribution. In an example, the time-varying random value or time-varying pseudo-random value can be based on a normal probability distribution. The reference voltage 315*b* can be modulated, and a difference between the modulated reference voltage and the output voltage 310*b* (Vout) can be provided to control circuitry, such as control circuitry 110. The control circuitry can provide a control signal 320*b* to driver circuitry, such as driver circuitry 115. The control signal 320*b* can be modulated as a result of the modulation applied to the reference voltage (Vref). The driver circuitry 115 can switch the input voltage (Vin) based on the received control signal, such as to provide a current 315*b* in an inductor, such as inductor 105*c*.

Figure 4A:
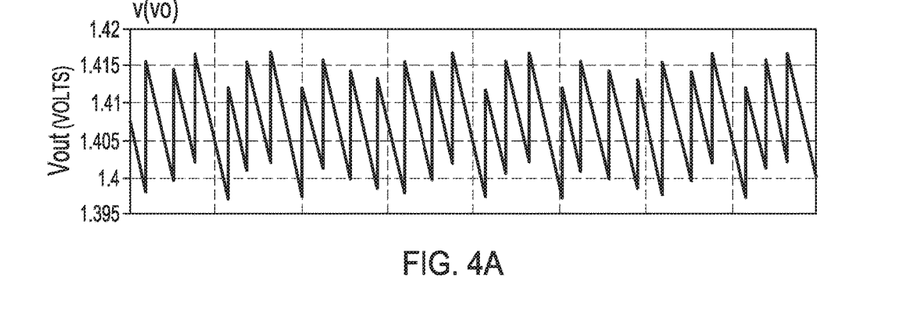
FIG. 4A illustrates an output voltage waveform in a voltage converter.
Figure 4B:
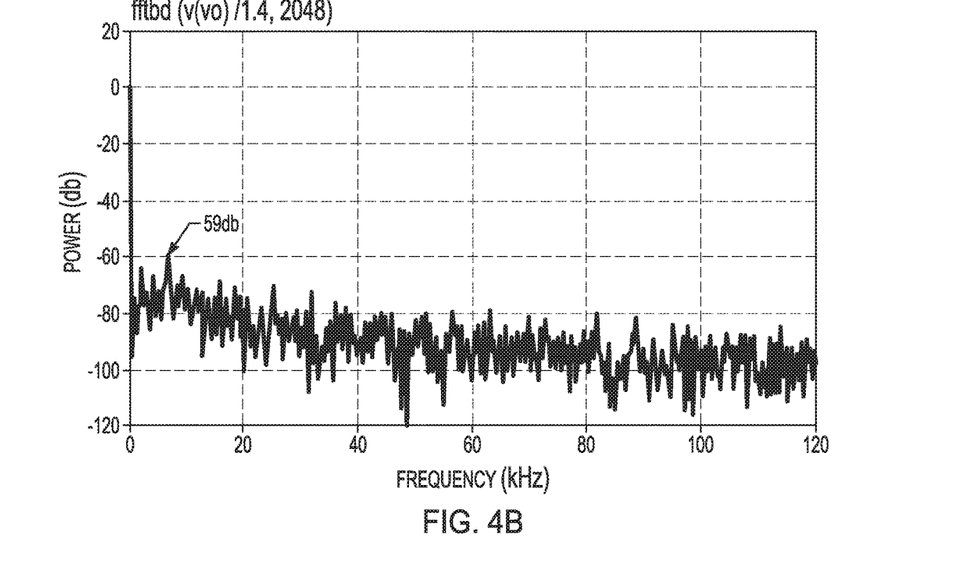
FIG. 4B illustrates an output power spectrum in a voltage converter.
Figure 4C:
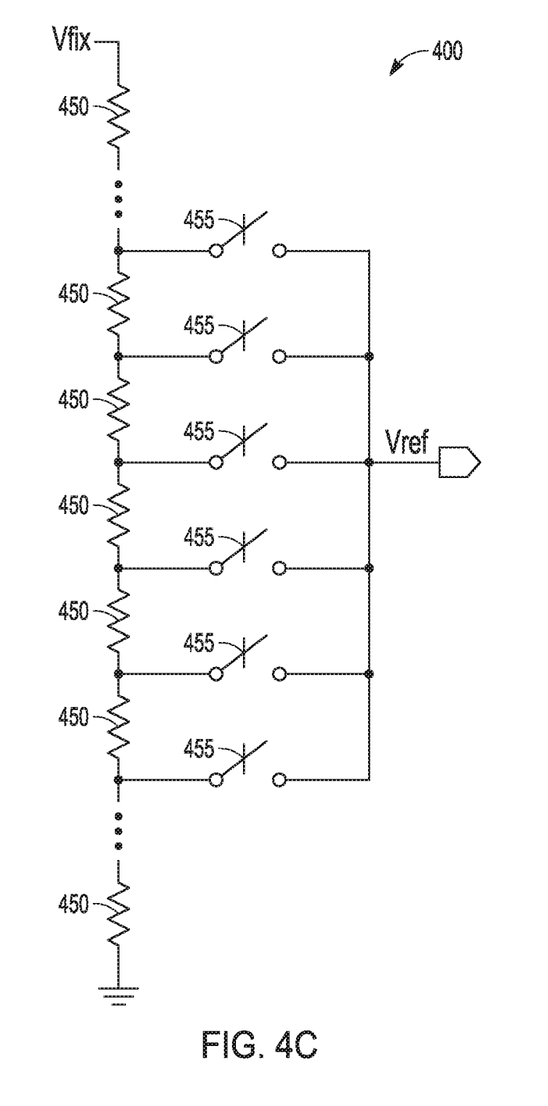
FIG. 4C illustrates a diagram of modulation circuitry.

FIG. 4A illustrates simulation results of an output voltage (Vout) of a voltage converter, such as voltage converter 100 where modulation circuitry 120 can modulate the reference voltage with a time-varying random value or time-varying pseudo-random value, such as to reduce the energy in the output ripple at the switching frequency of the voltage converter. In an example, the reference voltage can be modulated by modulation circuitry, such as modulation circuitry 400 shown in FIG. 4C. The modulation circuitry 400 can include resistors 450 and switches 455. The resistors 450 can be connected in series and can provide a connection between a constant voltage (Vfix) and electrical ground. A time varying random code or time varying pseudo-random code can be provided to the switches 455, such as to cause one of the switches to close, such as to provide a connection to a reference voltage (Vref). The other switches 455 can remain open. The value of the reference voltage (Vref) can be determined by a voltage divider formed by the resistors 450 and the switches 455. In an example, the resistors 450 and the switches 455 can be selected such that the reference voltage can be varied by an increment of 0.5%. The output voltage (Vout) shown in FIG. 4A includes a sawtooth shape with a frequency of about 4.5 kHz, an average value of about 1.4 V and an amplitude of about 25 mV. FIG. 4B illustrates simulation results of a power spectrum at the output of a voltage converter, such as voltage converter 100 where modulation circuitry 120 can modulate the reference voltage with a time-varying random value or time-varying pseudo-random value, such as to reduce the energy in the output ripple at the switching frequency of the voltage converter. The power spectrum as shown in FIG. 4B includes a 0 dB peak at 0 Hz, and a component corresponding to the switching frequency of the voltage converter having a −59 dB peak at 4.5 kHz, which can represent an at least 4 dB reduction in the energy of the output ripple at the switching frequency of the voltage converter when compared with a voltage converter having an unmodulated reference voltage. The power spectrum can also include components at multiples of the switching frequency (e.g., two times the switching frequency and three times the switching frequency).

Figure 2C:
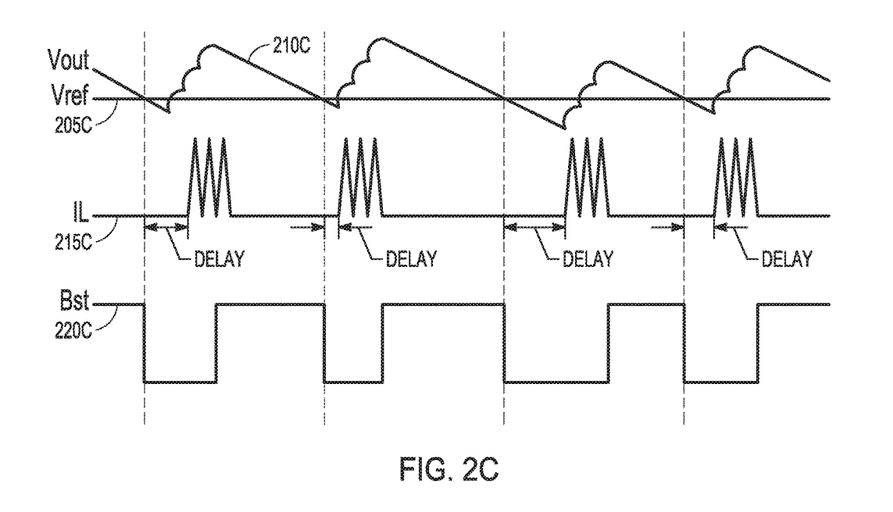
FIG. 2C illustrates an example of waveforms in a voltage converter.

FIG. 2C shows an example of waveforms in a voltage converter, such as voltage converter 100 where a control signal, such as that provided by control circuitry 110 can be modulated. The control signal 320b can be modulated such as to introduce a random or pseudo-random time delay of the control signal 320b. In an example, the switching frequency can be 4.5 kHz and the time delay time be varied between 0 μs and 12 μs. In an example, the modulation depth can be in a range of 1% to 5%. In an example, the modulation depth can be in a range of 1% to 3%. In an example, the modulation depth can be in a range of 3% to 5%. In an example, the modulation depth can be in a range of 2% to 4%. In an example, the modulation depth can be in a range of 2.5% to 3.5%. In an example, the modulation depth can be approximately 3%. The randomly modulated or pseudo-randomly modulated time delay of the control signal 320b can cause a random or pseudo-random delay in the switching of the voltage converter circuitry 105. The random or pseudo-random delay in the voltage converter circuitry 105 can introduce a random delay in current supplied to an inductor, such as inductor 105c. The random delay in the current supplied to the inductor can introduce a random or pseudo-random delay in the output voltage (Vout).

Figure 5A:
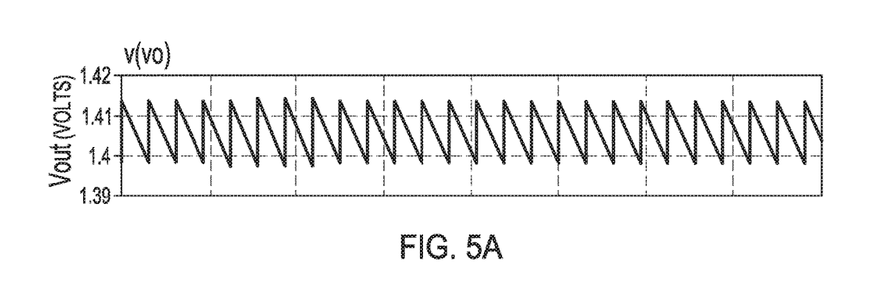
FIG. 5A illustrates an output voltage waveform in a voltage converter.
Figure 5B:
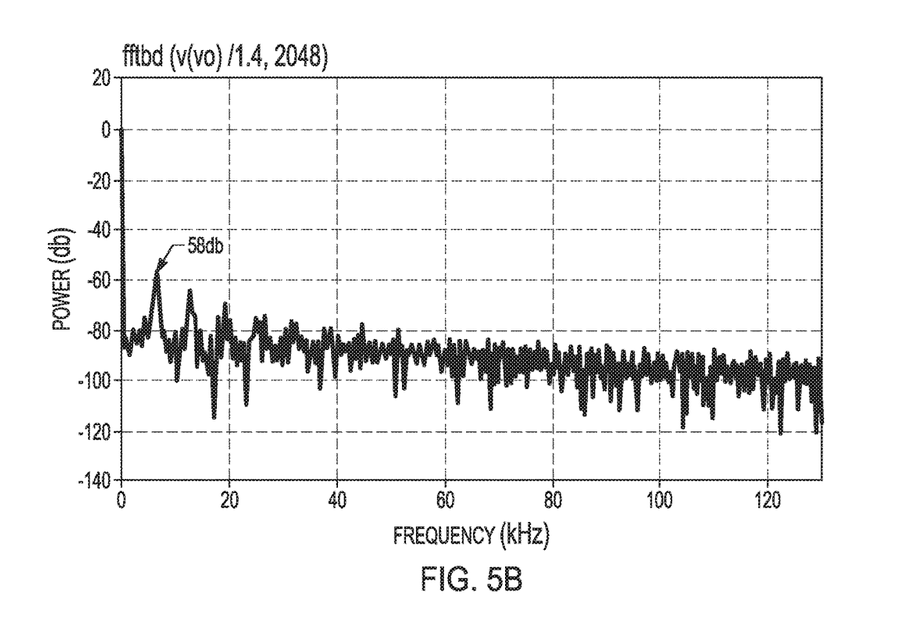
FIG. 5B illustrates an output power spectrum in a voltage converter.

FIG. 5A illustrates simulation results of an output voltage (Vout) of a voltage converter, such as voltage converter 100 where modulation circuitry 120 can delay the control signal by a time-varying random or pseudo-random amount of time, such as to reduce the energy in the output ripple at the switching frequency of the voltage converter. The output voltage (Vout) shown in FIG. 5A includes a sawtooth shape with a frequency of about 4.5 kHz, an average value of about 1.4 V and an amplitude of about 25 mV. FIG. 5B illustrates simulation results of a power spectrum at the output of a voltage converter, such as voltage converter 100 where modulation circuitry 120 can delay the control signal by a time-varying random or pseudo-random amount of time. The power spectrum as shown in FIG. 5B includes 0 dB peak at 0 Hz, and a component corresponding to the switching frequency of the voltage converter having an amplitude of −58 dB at 4.5 kHz, which can represent an at least 3 dB reduction in the energy of the output ripple at the switching frequency of the voltage converter when compared with a voltage converter having an unmodulated reference voltage. The power spectrum can also include components at multiples of the switching frequency (e.g., two times the switching frequency and three times the switching frequency).

Figure 6:
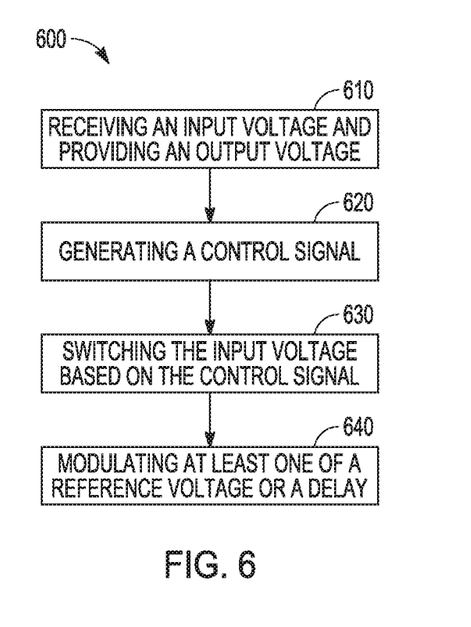
FIG. 6 illustrates a method of operation of a voltage converter.

FIG. 6 illustrates an example of a method of operating a voltage converter, such as the voltage converter 100, such as to provide a reduction in an output ripple energy at a switching frequency of the voltage converter. Converter circuitry, such as the converter circuitry 105 can receive an input voltage and provide an output voltage having a frequency component at the switching frequency (step 610). Control circuitry, such as the control circuitry 110 can generate a control signal based on the output voltage received from the converter circuitry 105 and a reference voltage (step 620). Driver circuitry, such as the driver circuitry 115 can switch the input voltage based on the control signal received from control circuitry, such as the control circuitry 110 (step 630). Modulation circuitry, such as modulation circuitry 120 can modulate at least one of the reference voltage or a delay used to generate the control signal (step 640). The modulation circuitry can modulate an amplitude of the reference voltage with a time-varying random value or pseudo-random value, to provide a reduction in the output ripple energy at the switching frequency of the voltage converter. Modulating the amplitude of the reference can include providing a time-varying randomly generated trimming code to digital-to-analog converter. In an example, the modulation circuitry can delay the control signal by a varying a random or pseudo-random amount of time to provide a reduction in the output ripple energy at the switching frequency of the voltage converter. The reduction in the output ripple energy at the switching frequency can be accompanied by a corresponding increase in energy of at least one frequency different than the switching frequency. Delaying the control signal by a varying random or pseudo-random amount of time can include charging a capacitor with a time-varying randomly generated current based on the control signal to provide the delay in the control signal. In an example, modulating the amplitude of the reference voltage or the time delay of the control signal can provide a reduction in the output ripple energy at the switching frequency of the voltage converter and a reduction in the output ripple energy at multiples of the switching frequency (e.g., at two times the switching frequency or three times the switching frequency).

The invention claimed is:

1. A method for voltage conversion providing a reduction in an output ripple energy at a switching frequency of a voltage converter, the method comprising:
   receiving an input voltage and providing an output voltage having a frequency component at the switching frequency;
   generating a control signal based on the output voltage and a reference voltage;
   switching the input voltage based on the control signal; and
   randomly or pseudo-randomly modulating at least one of the reference voltage or a delay used to generate the control signal to provide a decrease in the output ripple energy at the switching frequency of the voltage converter.

2. The method of claim 1 comprising driving a load with the output voltage and wherein the switching frequency depends on the load.

3. The method of claim 2 comprising modulating an amplitude of the reference voltage with a time-varying random value or pseudo-random value to provide a reduction in the output ripple energy at the switching frequency of the voltage converter.

4. The method of claim 3 comprising converting at least a portion of output ripple energy at the switching frequency to energy at a different frequency.

5. The method of claim 3 wherein modulating the amplitude of the reference voltage includes providing a time-varying randomly generated trimming code to a digital-to-analog converter.

6. The method of claim 2 comprising delaying the control signal by a varying random amount of time to provide a reduction in the output ripple energy at the switching frequency of the voltage converter.

7. The method of claim 6 comprising converting at least a portion of output ripple energy at the switching frequency to energy at a different frequency.

8. The method of claim 6 comprising charging a capacitor with a time-varying randomly generated current based on the control signal to provide the delay in the control signal.

9. The method of claim 2 wherein modulating at least one of the reference voltage or a delay used to generate the control signal reduces an output ripple energy at a multiple of the switching frequency of the voltage converter.

10. The method of claim 1, wherein the randomly or pseudo-randomly modulating of the at least one reference voltage or the delay used to generate the control signal is random.

11. The method of claim 1, wherein the randomly or pseudo-randomly modulating of the at least one reference voltage or the delay used to generate the control signal is pseudo-random.

12. A voltage converter for providing a reduction in an output ripple energy at a switching frequency of the voltage converter, the voltage converter comprising:
switching voltage converter circuitry configured to receive an input voltage and provide an output voltage having a frequency component at the switching frequency;
a control element configured to provide a control signal based on the output voltage and a reference voltage, the control signal controlling the switching voltage converter circuitry; and
modulation circuitry configured to randomly or pseudo-randomly modulate at least one of the reference voltage or a delay used to generate the control signal to provide a decrease in the output ripple energy at the switching frequency of the voltage converter.

13. The voltage converter of claim 12 wherein the switching voltage converter circuitry is configured to drive a load with the output voltage and wherein the switching frequency depends on the load.

14. The voltage converter of claim 13 wherein the modulation circuitry is configured to modulate an amplitude of the reference voltage with a time-varying random value or pseudo-random value to provide a reduction in the output ripple energy at the switching frequency of the voltage converter.

15. The voltage converter of claim 14 wherein the modulation circuitry is configured to convert at least a portion of output ripple energy at the switching frequency to energy at a different frequency.

16. The voltage converter of claim 13 wherein the modulation circuitry is configured to provide a time-varying randomly generated or pseudo-randomly generated trimming code to a digital-to-analog converter.

17. The voltage converter of claim 16 comprising variable delay circuitry configured to delay the control signal by a varying random or pseudo-random amount of time to provide a reduction in the output ripple energy at the switching frequency of the voltage converter.

18. The voltage converter of claim 17 wherein the modulation circuitry is configured to convert at least a portion of output ripple energy at the switching frequency to energy at a different frequency.

19. The voltage converter of claim 17 comprising a current source configured to charge a capacitor with a time-varying current in response to the control signal to provide the delay in the control signal.

20. The voltage converter of claim 13 wherein modulating at least one of the reference voltage or a delay used to generate the control signal reduces an output ripple energy at a multiple of the switching frequency of the voltage converter.

21. The voltage converter of claim 12 wherein the control element includes a hysteretic comparator configured to provide a first control signal if the output voltage exceeds the reference voltage by a first threshold amount and a second control signal if the output voltage is less than the reference voltage by more than a second threshold amount.

22. The voltage converter of claim 12, wherein the modulation circuitry is configured to randomly modulate the at least one of the reference voltage or the delay used to generate the control signal.

23. The voltage converter of claim 12, wherein the modulation circuitry is configured to pseudo-randomly modulate the at least one of the reference voltage or the delay used to generate the control signal.

24. A voltage converter for providing a reduction in an output ripple energy at a switching frequency of the voltage converter, the voltage converter comprising:
means for receiving an input voltage and providing an output voltage having a frequency component at the switching frequency;
means for generating a control signal based on the output voltage and a reference voltage;
means for switching the input voltage based on the control signal; and
means for randomly or pseudo-randomly modulating at least one of the reference voltage or a delay used to generate the control signal to provide a decrease in the output ripple energy at the switching frequency of the voltage converter.

* * * * *